(12) United States Patent
Yonezu et al.

(10) Patent No.: US 6,667,915 B2
(45) Date of Patent: Dec. 23, 2003

(54) SEMICONDUCTOR MEMORY DEVICE HAVING REDUNDANCY STRUCTURE WITH DEFECT RELIEVING FUNCTION

(75) Inventors: Toshiaki Yonezu, Hyogo (JP); Yoshinori Fujiwara, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/225,240

(22) Filed: Aug. 22, 2002

(65) Prior Publication Data

US 2003/0058716 A1 Mar. 27, 2003

(30) Foreign Application Priority Data

Sep. 27, 2001 (JP) ........................................ 2001-296442

(51) Int. Cl.[7] ................................................ G11C 7/00
(52) U.S. Cl. .................. 365/200; 365/201; 365/230.06
(58) Field of Search ................................ 365/201, 200, 365/225.7, 230.01, 230.06, 189.07

(56) References Cited

U.S. PATENT DOCUMENTS

| 5,060,197 A | * | 10/1991 | Park et al. | .................... 365/200 |
| 5,257,229 A | * | 10/1993 | McClure et al. | ............. 365/200 |
| 5,414,659 A | * | 5/1995 | Ito | .............................. 365/200 |
| 5,485,424 A | * | 1/1996 | Kawamura | ................... 365/200 |
| 5,841,708 A | * | 11/1998 | Nagata | ........................ 365/200 |

FOREIGN PATENT DOCUMENTS

JP  2001-35186  2/2001

* cited by examiner

*Primary Examiner*—Thong Le
(74) *Attorney, Agent, or Firm*—McDermott, Will & Emery

(57) ABSTRACT

Redundancy decoders corresponding to a plurality of redundancy circuits, each of which is for relieving a defective memory cell, are classified into a high-priority redundancy decoder used with a higher priority and the other low-priority decoders. When a defective address stored inside is designated as an accessing object, each of the low-priority decoders activates a corresponding redundancy circuit, except for the case where a defective address stored in the high-priority redundancy decoder agrees with an address signal.

6 Claims, 4 Drawing Sheets

SEMICONDUCTOR MEMORY DEVICE HAVING REDUNDANCY STRUCTURE WITH DEFECT RELIEVING FUNCTION

BACKGROUND OF THE INVENTION

Field of the Invention

The present invention relates to a semiconductor memory device, and more particularly, to a semiconductor memory device having a redundancy circuit for relieving a defective memory cell.

DESCRIPTION OF THE BACKGROUND ART

In recent years, it has been essential for a semiconductor memory device with increasing capacity to have a redundancy circuit mounted therein to improve yields of products. The redundancy circuit is provided for replacing and relieving a defective memory cell, which is detected by an operation test, with a spare memory cell provided as an extra. Information related to the process of relieving the defective memory cell is programmed into the redundancy circuit and stored inside in a non-volatile manner.

The information programmed in the redundancy circuit includes a defective address indicating an address of a defective memory cell. At the time of using, when an access to the defective memory cell is required, the redundancy circuit is used in place of the defective memory cell to execute data reading and data writing.

Such a configuration allows the entire semiconductor memory device to normally operate using the redundancy circuit constituted by a spare memory cell, even if a defective memory cell occurs due to a defect at manufacturing. This allows secured yields of products.

However, the operation test for the semiconductor memory device is executed at different stages, such as a wafer test executed in a wafer state after fabrication of the wafer, and a product test executed in a product state after the subsequent step of assembling. In particular, the product test is performed after execution of a screening test (accelerated test) for revealing a potential failure.

Thus, if a defective memory cell is detected at the product test performed subsequent to the stage of the wafer test where a defective memory cell was detected and once relieved by a redundancy circuit, the process of replacing and relieving by the redundancy circuit must be programmed in consideration of the results of the both operation tests. This will require a more complicated analysis for relieving of the defective memory cell.

In particular, the analysis for relieving becomes complicated when a failure is detected again in a memory cell that was once relieved at the product test, after relieving of a defective memory cell detected at the wafer test had been programmed into the redundancy circuit. Thus, if the defective memory cell detected at the product test was once relieved at a row-related redundancy circuit after the wafer test, the defective memory cell must be relieved by a column-related redundancy circuit. On the contrary, if the defective memory cell detected at the product test was once relieved by a column-related redundancy circuit after the wafer test, the defective memory cell must be relieved by a row-related redundancy circuit. In such a case, the analysis for relieving performed after the product test becomes particularly complicated.

SUMMARY OF THE INVENTION

It is an object of the present invention to provide a semiconductor memory device which is configured that a defective memory cell detected by an operation test can be relieved without the need for a complicated analyzing process.

According to an aspect of the present invention, a semiconductor memory device includes a plurality of memory cells; a plurality of redundancy circuits, each of which is used to relieve a defective memory cell that occurred in the plurality of memory cells; and a redundancy control circuit to selectively activate one of the plurality of redundancy circuits when the defective memory cell is designated as an accessing object. The redundancy control circuit includes a first redundancy decoder arranged corresponding to one of the plurality of redundancy circuits and activating the corresponding one redundancy circuit when a defective address stored inside is designated as the accessing object; and a second redundancy decoder arranged corresponding to another one of the plurality of redundancy circuits and activating the corresponding another one redundancy circuit when a defective address stored inside is designated as the accessing object, except for the case where the defective address stored in the first redundancy decoder is designated as the accessing object.

Preferably, when the defective address stored in the first redundancy decoder is designated as the accessing object, the second redundancy decoder inactivates the corresponding another one redundancy circuit, irrespective of whether or not the defective address stored the inside is designated as the accessing object.

Such a semiconductor memory device can execute a replacement and relieving process adapted to the defective address stored in the first redundancy decoder used with a higher priority, without consideration given to the defective address stored in the second redundancy decoder used with a lower priority. Therefore, a final defective memory cell can be replaced and relieved by a redundancy circuit corresponding to the first redundancy decoder (a high-priority decoder) without the need for any consideration given to the defective memory cell detected in the past or the replacement and relieving process corresponding thereto. Thus, a problem can be avoided in that a plurality of memory cell rows or memory cell columns are selected within the same memory array, which may be caused by the problem in the analysis for relieving, without a complicated analyzing process.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
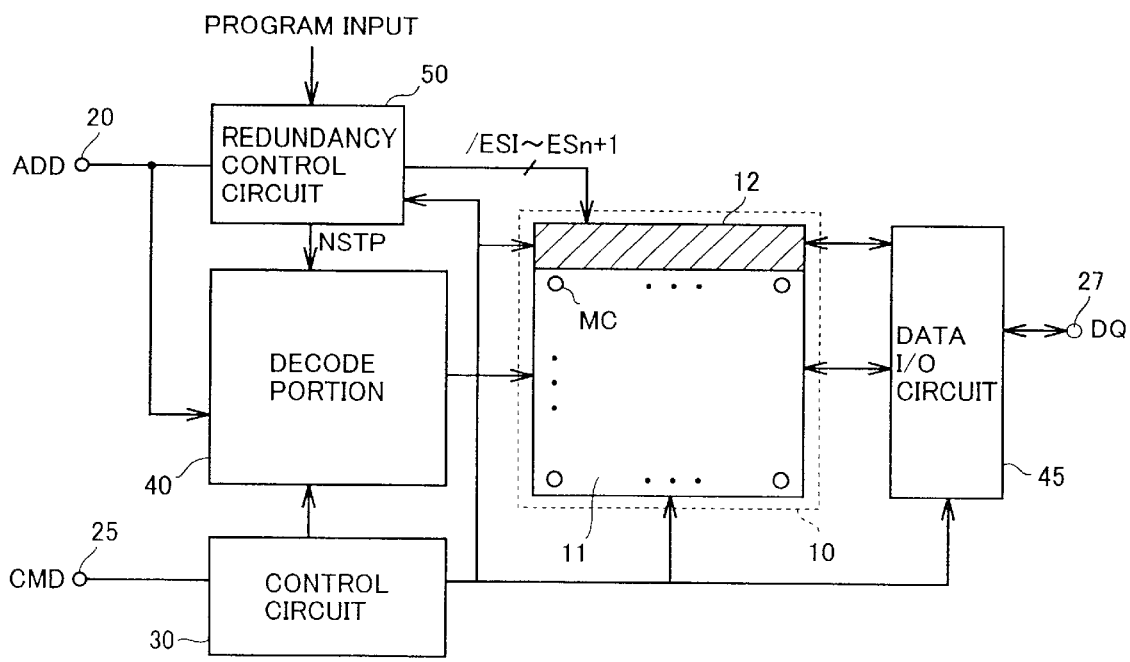
FIG. 1 is a schematic block diagram showing the configuration of a semiconductor memory device according to an embodiment of the present invention.

Embodiments of the present invention will be described below in detail with reference to the drawings. It is noted that the same reference characters in the drawings denote the same or corresponding portions.

First Embodiment

Referring to FIG. 1, a semiconductor memory device 1 according to the present embodiment includes a memory array 10, an address terminal 20, a control signal terminal 25, a data terminal 27, a control circuit 30, a decode portion 40, a data input/output circuit (data I/O circuit) 45, and a redundancy control circuit 50.

Memory array 10 includes a plurality of memory cells. Memory array 10 is divided into a normal memory cell region 11 in which normal memory cells MC are arranged in a matrix of rows and columns and a spare memory cell region 12 in which spare memory cells that are provided as backup are arranged for reliving a defective memory cell occurred in the normal memory cells. A plurality of spare memory cells provided in spare memory cell region 12 are used to constitute a plurality of redundancy circuits (not shown). Each of the redundancy circuits corresponds to, for example, a spare row or a spare column, which is activated when a defective memory cell is to be accessed, to replace and relieve a normal memory cell row or column including the defective memory cell.

Address terminal 20 receives an input of an address signal ADD for designating an object to be accessed (hereinafter referred to as accessing object). Address signal ADD designates a row address and a column address to designate a selected memory cell in normal memory cell region 11. Control signal terminal 25 receives an input of a command control signal CMD for giving an operation instruction to semiconductor memory device 1. Data terminal 27 exchanges read/write data DQ that are input/output to/from memory array 10 with the outside. Control circuit 30 controls the entire operation of semiconductor memory device 1 for executing the designated operation in response to command control signal CMD input into control signal terminal 25.

Decode portion 40 executes row selection and column selection in normal memory cell region 11 in response to address signal ADD input into address terminal 20. Data I/O circuit 45 outputs the data that is read from memory array 10 at data reading to data terminal 27, and also writes the data that is input into data terminal 27 at data writing to memory array 10.

Redundancy control circuit 50 stores a defective address indicating a defective memory cell by an external program input. For example, these defective addresses are stored in a non-volatile manner into redundancy control circuit 50 by a fuse element that can be trimmed by laser. In such a case, a laser input is used as a program input.

Redundancy control circuit 50 compares address signal ADD input into address terminal 20 with the defective address information stored inside, and when a defective memory cell is designated as an accessing object, redundancy control circuit 50 instructs decode portion 40 to stop accessing to normal memory cell region 11 by a normal access stop control signal NSTP. Moreover, redundancy control circuit 50 selectively activates a redundancy circuit corresponding to the defective address that is designated as an accessing object. For example, when (n+1) redundancy circuits (n is a natural number) are provided, spare selection signals /ES1 to /ESn+1 corresponding to the respective (n+1) redundancy circuits are selectively activated, to allow activation of a redundancy circuit corresponding to the defective address designated as an accessing object.

Thus, when a defective memory cell in normal memory cell region 11 is designated as an accessing object, the defective memory cell can be replaced and relieved by accessing to the activated redundancy circuit in spare memory cell region 12.

Figure 2:
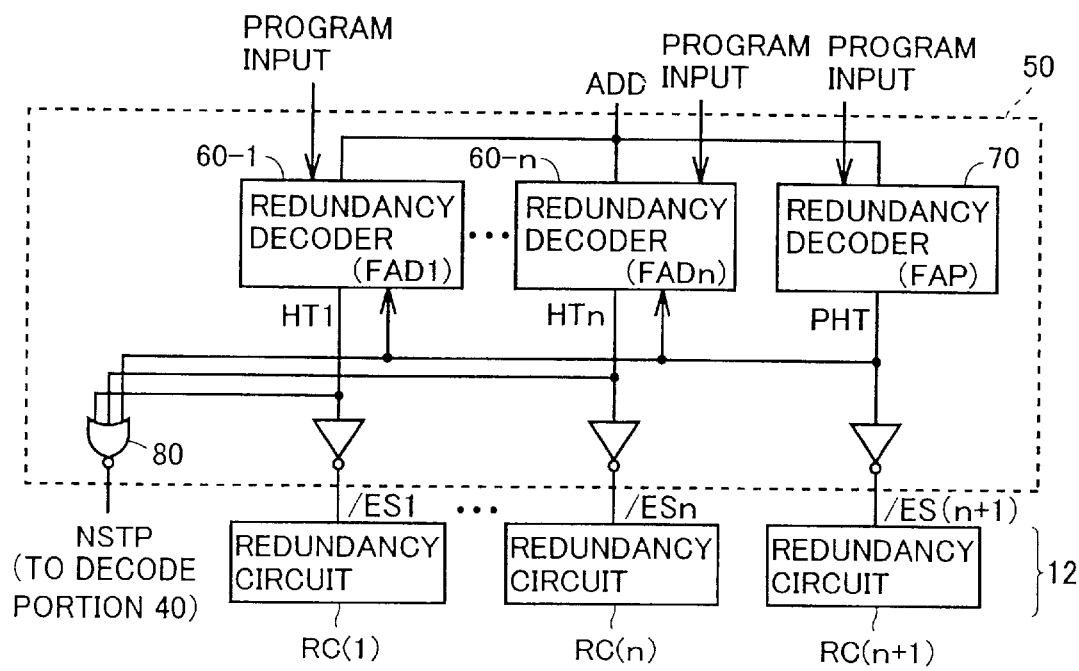
FIG. 2 is a circuit diagram showing the configuration of a redundancy control circuit shown in FIG. 1.

Referring to FIG. 2, redundancy control circuit 50 includes redundancy decoders 60-1 to 60-n provided corresponding to redundancy circuits RC(1) to RC(n), respectively, of the (n+1) redundancy circuits; and a redundancy decoder 70 provided corresponding to a redundancy circuit RC (n+1).

Redundancy decoders 60-1 to 60-n store therein different defective addresses FAD1 to FADn respectively in a non-volatile manner. Redundancy decoder 70 has a defective address FAP input therein. It is noted that defective address FAP stored in redundancy decoder 70 may be the same as any one of defective addresses FAD1 to FADn stored in redundancy decoders 60-1 to 60-n respectively.

Redundancy decoders 60-1 to 60-n output, respectively, agreement determination signals HT1 to HTn for indicating the result of agreement comparison between defective addresses FAD 1 to FADn stored therein and address signal ADD input into address terminal 20. Redundancy decoder 70 outputs an agreement determination signal PHT indicating the result of agreement comparison between defective address FAP stored therein and address signal ADD. In the present embodiment, for each of redundancy decoders 60-1 to 60-n and 70, a corresponding agreement determination signal is set to be at a logic high or "H" level when the defective address stored inside agrees with address signal ADD.

Agreement determination signals HT1 to HTn and PHT output by redundancy decoders 60-1 to 60-n and 70, respectively, are inverted by inverters and thereafter are transmitted to redundancy circuits RC(1) to RC(n) and to RC(n+1), respectively, as spare selection signals /ES1 to /ESn and /ESn+1. Each of redundancy circuits RC(1) to RC (n+1) is activated when a corresponding spare selection signal is activated to be at a logic row or "L" level, and is to be accessed in place of a memory cell row or memory cell column including the defective memory cell.

Redundancy control circuit 50 further includes a normal access stop control portion 80 for stopping the operation of decode portion 40 when address signal ADD agrees with any one of the defective addresses. Normal access stop control portion 80 is constituted by an NOR logic gate producing an output of the result of an NOR operation for agreement determination signals HT1 to HTn and PHT output from redundancy decoders 60-1 to 60-n, respectively, as normal access stop control signal NSTP. Thus, when address signal ADD agrees with a defective address in any one of redundancy decoders 60-1 to 60-n and 70, normal access stop control signal NSTP is set to be at the "L" level to stop the accessing operation by decode portion 40 to normal memory cell region 11.

Redundancy decoders 60-1 to 60-n and 70 are classified into redundancy decoder 70 of which the agreement determination result is used with a higher priority, and other redundancy decoders 60-1 to 60-n with lower priorities. Hereinafter, redundancy decoder 70 of which the agreement determination result is used with a higher priority is also referred to as a "high-priority redundancy decoder."

Moreover, the other redundancy decoders 60-1 to 60-n are also referred to as "low-priority redundancy decoders."

Agreement determination signal PHT from high-priority redundancy decoder 70 is input into each of low-priority redundancy decoders 60-1 to 60-n. Agreement determination signals HT1 to HTn output by low-priority redundancy decoders 60-1 to 60-n are forcibly set to the "L" level indicating disagreement, when agreement determination signal PHT is set to the "H" level, i.e., when defective address FAP stored in high-priority redundancy decoder 70 agrees with address signal ADD.

Thus, when defective address FAP held in high-priority redundancy decoder 70 is designated as an accessing object, activation of a redundancy circuit by low-priority redundancy decoders 60-1 to 60-n are forcibly stopped even when the same defective address is stored in any one of low-priority redundancy decoders 60-1 to 60-n. Moreover, the operation test for obtaining defective address FAP stored in high-priority redundancy decoder 70 is executed later than the operation test for obtaining defective addresses FAD1 to FADn stored in low-priority redundancy decoders 60-1 to 60-n. As a result, a new replacement and relieving process can be programmed by high-priority redundancy decoder 70, irrespective of what kind of replacement and relieving process has been programmed into low-priority redundancy decoders 60-1 to 60-n in the past, i.e., what defective address has been stored therein.

Figure 3:
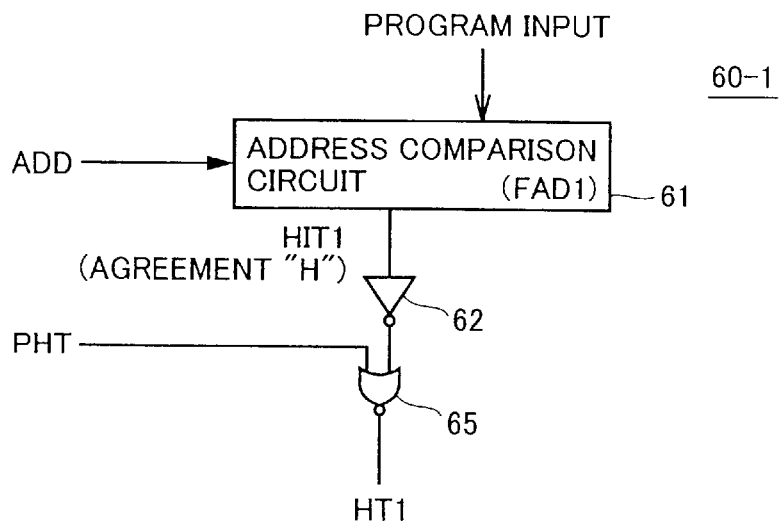
FIG. 3 is a block diagram showing the configuration of low-priority redundancy decoders 60-1 to 60-n.

FIG. 3 shows a block diagram showing the configuration of low-priority redundancy decoders 60-1 to 60-n. Each of low-priority redundancy decoders 60-1 to 60-n has a similar configuration, and thus the configuration of low-priority redundancy decoder 60-1 is representatively shown in FIG. 3.

Referring to FIG. 3, low-priority redundancy decoder 60-1 includes an address comparison circuit 61, an inverter 62, and an agreement comparison invalidiation circuit 65.

Address comparison circuit 61 stores defective address FAD1 in a non-volatile manner by an external program input, while generating an address agreement signal HIT1 indicating the result of an agreement comparison between address signal ADD input into address terminal 20 and defective address FAD1. Address agreement signal HIT1 is set to the "H" level when address signal ADD agrees with defective address FAD1, whereas it is set to the "L" level when they disagree with each other.

High-priority redundancy decoder 70 only has a portion corresponding to address comparison circuit 61, which stores defective address FAP in a non-volatile manner while generating agreement determination signal PHT indicating the result of agreement comparison between address signal ADD input into address terminal 20 and defective address FAP. Agreement determination signal PHT is set to the "H" level when address signal ADD agrees with defective address FAP, whereas is set to the "L" level when they disagree with each other.

Inverter 62 inverts and outputs address agreement signal HIT1. As already described, the operation of each of low-priority redundancy decoders 60-1 to 60-n is different depending on the agreement determination result (agreement determination signal PHT) at high-priority redundancy decoder 70, so that the operation timing of each redundancy decoder is adjusted by appropriately designing signal propagation time of inverter 62. Agreement comparison invalidation circuit 65 is constituted by a logic gate that receives agreement determination signal PHT from high-priority redundancy decoder 70 and an output of inverter 62, and outputs the result of an NOR operation thereof as agreement determination signal HT1.

Therefore, when agreement determination signal PHT from high-priority redundancy decoder 70 is set to the "H" level, i.e., when address signal ADD agrees with defective address FAP stored in high-priority redundancy decoder 70, agreement determination signal HT1 from redundancy decoder 60-1 is forcibly fixed at the "L" level by agreement comparison invalidation circuit 65. Accordingly, spare selection signal /ES1 of redundancy circuit RC(1) corresponding to redundancy decoder 60-1 is forcibly inactivated to the "H" level.

On the other hand, when agreement determination signal PHT from priority redundancy decoder 70 is at the "L" level, i.e., when address signal ADD disagrees with defective address FAP of high-priority redundancy decoder 70, agreement determination signal HT1 is set in accordance with address agreement signal HIT1 output from address comparison circuit 61. Thus, when address agreement signal HIT is at the "H" level, i.e., when address signal ADD agrees with defective address FAD 1, agreement determination signal HT1 is set to the "H" level by inverter 62 and agreement comparison invalidation circuit 65. In response thereto, corresponding spare selection signal /ES1 is activated to be at the "L" level. This activates redundancy circuit RC(1) corresponding to redundancy decoder 60-1 to be an accessing object.

Figure 4:
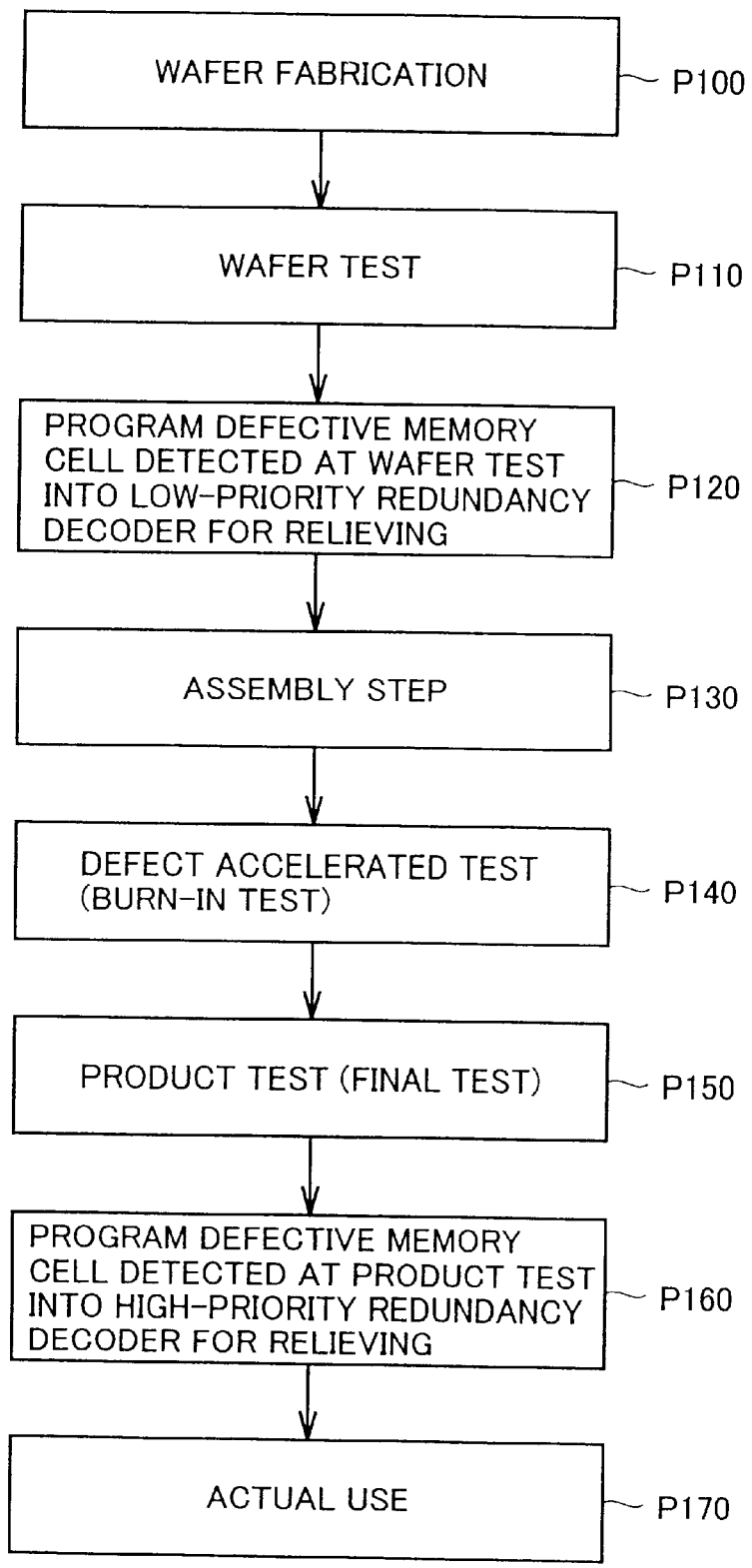
FIG. 4 is a flow chart illustrating the relation between a manufacturing process of the semiconductor memory device according to the first embodiment and a program of a defective address for a redundancy decoder.

Referring to FIG. 4, circuits constituting semiconductor memory device 1 according to the first embodiment are fabricated on a wafer (process P100), and thereafter an operation test in a wafer state, i.e., a wafer test, is executed (process P110). A defective memory cell detected at the stage of the wafer test is replaced and relieved by storing, i.e., programming, a corresponding defective address into low-priority redundancy decoders 60-1 to 60-n (process P120). Low-priority redundancy decoders 60-1 to 60-n each stores a defective address by, for example, a fuse element or an anti-fuse element that is blown by a laser input. In such a case, the process P120 corresponds to a so-called laser blowing step.

After the defective memory cell detected by the wafer test is replaced and relieved, an assembly step is executed (process P130), and semiconductor memory device 1 is enclosed in a package to be in a product state. For semiconductor memory device 1 in the product state, a defect accelerated test (burn-in test) is executed for revealing a potential defect by applying a stress such as a high voltage or high temperature (process P140).

After the burn-in test is terminated, a product test which is an operation test in the product state is executed to confirm presence/absence of a final failure (process P150). The product test is also referred to as a final test, since it includes a final check before shipping. A defective memory cell detected at the product test is replaced and relieved by programming a corresponding defective address into high-priority redundancy decoder 70 (process P160). High-priority redundancy decoder 70 stores a defective address using, for example, an electric fuse element or anti-fuse element that can be blown by a high voltage input from the outside the package. It is noted that the step of programming the defective addresses into low-priority redundancy decoders 60-1 to 60-n (process P120) and the step of programming the defective address into high-priority redundancy decoder 70 can be collectively executed as one step.

Such a configuration can allow replacement and relieving of the defective memory cell finally detected at the product test, without the need for any consideration given to the replacement and relieving process based on passed operation tests such as the wafer test. As a result, the final defective memory cell can simply be relieved to be used without consideration of consistency with the replacement and relieving process executed before the product test, i.e., without a complicated analyzing process (process P170). This eliminates a problem in that a plurality of memory cells or memory columns are selected within the same memory array, which may be caused by the problem of analysis for relieving.

Second Embodiment

In the second embodiment, the configuration of a redundancy control circuit will be described that can accommodate to the case where a plurality of high-priority redundancy decoders are arranged.

Figure 5:
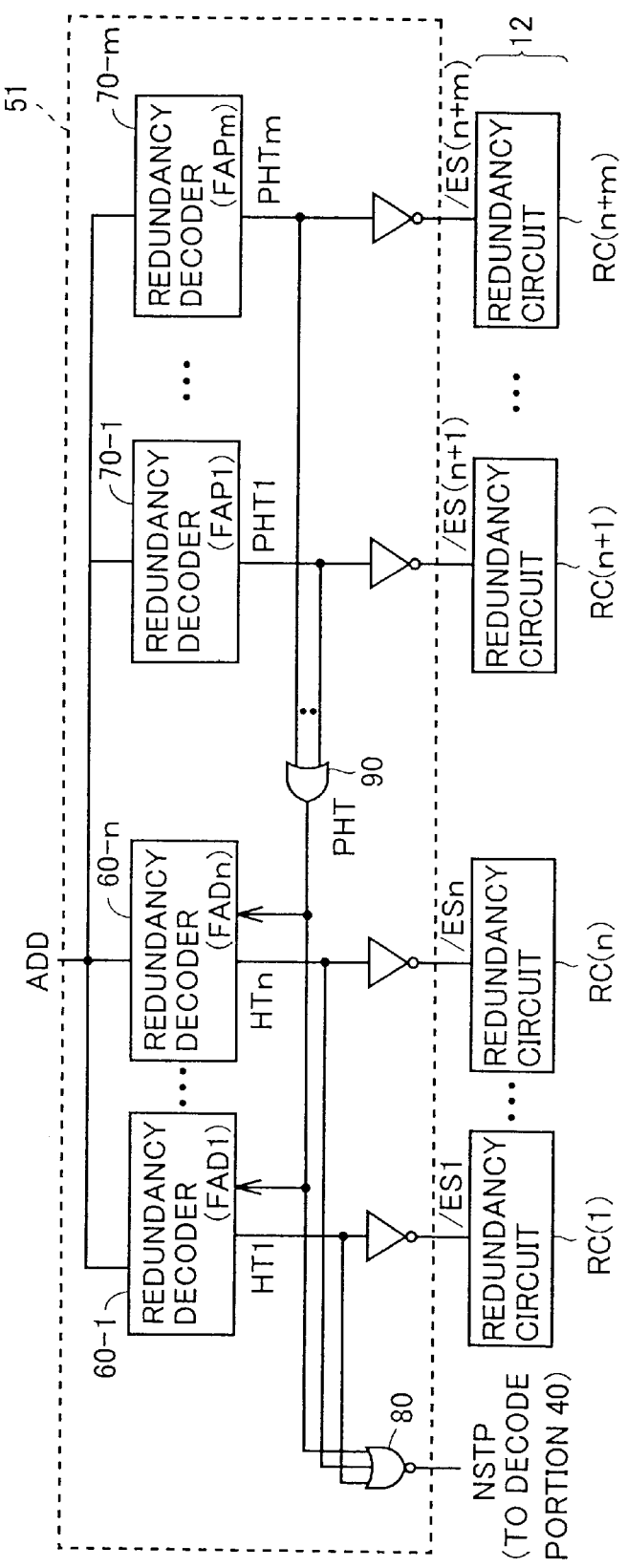
FIG. 5 is a block diagram showing the configuration of a redundancy control circuit according to the second embodiment.

Referring to FIG. 5, a redundancy control circuit 51 according to the second embodiment is different from redundancy control circuit 50 according to the first embodiment shown in FIG. 2, in that it further includes a plurality of high-priority redundancy decoders and a selection stop circuit 90. Redundancy control circuit 51 includes high-priority redundancy decoders 70-1 to 70-m (m is a natural number).

High-priority redundancy decoders 70-1 to 70-m are provided corresponding to redundancy circuits RC(n+1) to RC(n+m) respectively. The configuration of each of high-priority redundancy decoders 70-1 to 70-n is similar to that of the high-priority redundancy decoder according to the first embodiment. High-priority redundancy decoders 70-1 to 70-m store therein different defective addresses FAP1 to FAPm respectively. High-priority redundancy decoders 70-1 to 70-m activate corresponding agreement determination signals PHT1 to PHTm to the "H" level when address signal ADD input into address terminal 20 agrees with defective addresses stored respectively therein. This activates spare selection signals /ESn+1 to ESn+m for activating redundancy circuits RC(n+1) to RC(n+m) respectively, based on the result of agreement determination at high-priority redundancy decoders 70-1 to 70-m.

In the configuration according to the second embodiment, agreement determination signal PHT is used as a signal indicating agreement between address signal ADD and a defective address in any one of high-priority redundancy decoders 70-1 to 70-m. Thus, agreement determination signal PHT is generated by selection stop circuit 90 constituted by a logic gate producing an output of the result of an OR operation for agreement determination signals PHT1 to PHTm corresponding to high-priority redundancy decoders 70-1 to 70-m respectively. Low-priority redundancy decoders 60-1 to 60-n and normal access stop control portion 80 operate in response to address signal ADD and agreement determination signal PHT in a manner similar to that in the first embodiment, so that the detailed description thereof will not be repeated.

Such a configuration allows execution of replacement and relieving operation similar to that in the first embodiment, even if a plurality of high-priority redundancy decoders, of which agreement determination results are used with higher priority, are arranged. This enables simple replacement and relieving of the defective memory cell detected finally, without any complicated analysis for relieving.

Moreover, the degree of priorities for the redundancy decoders can be made more hierarchical. That is, a redundancy decoder having a priority higher than that of the high-priority redundancy decoder shown in each of the first and second embodiments can further be arranged using a similar configuration. However, as also shown in the first and second embodiments, consideration must be given so as not to store the same defective address into a plurality of redundancy decoders having the same degree of priority.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a plurality of memory cells;
   a plurality of redundancy circuits, each of which is used to relieve a defective memory cell that occurred in said plurality of memory cells; and
   a redundancy control circuit to selectively activate one of said plurality of redundancy circuits when said defective memory cell is designated as an accessing object, said redundancy control circuit including
      a first redundancy decoder arranged corresponding to one of said plurality of redundancy circuits, and activating the corresponding one redundancy circuit when a defective address stored inside is designated as said accessing object, and
      a second redundancy decoder arranged corresponding to another one of said plurality of redundancy circuits, and activating the corresponding another one redundancy circuit when a defective address stored inside is designated as said accessing object, except for a case where the defective address stored in said first redundancy decoder is designated as said accessing object, wherein
   when the defective address stored in said first redundancy decoder is designated as said accessing object, said second redundancy decoder inactivates said corresponding another one redundancy circuit, irrespective of whether or not the defective address stored said inside is designated as said accessing object.

2. The semiconductor memory device according to claim 1, wherein
   said second redundancy decoder includes
      an address comparison circuit to activate an agreement determination signal when an address signal indicating said accessing object agrees with the defective address stored in said second redundancy decoder, and
      an agreement comparison invalidation circuit to forcibly inactivate said agreement determination signal when the defective address stored in said first redundancy decoder is designated as said accessing object; and
   the redundancy circuit corresponding to said second redundancy decoder is activated and inactivated in response to said agreement determination signal.

3. A semiconductor memory device, comprising:
   a plurality of memory cells;
   a plurality of redundancy circuits, each of which is used to relieve a defective memory cell that occurred in said plurality of memory cells; and
   a redundancy control circuit to selectively activate one of said plurality of redundancy circuits when said defective memory cell is designated as an accessing object, said redundancy control circuit including
      a first redundancy decoder arranged corresponding to one of said plurality of redundancy circuits, and activating the corresponding one redundancy circuit when a defective address stored inside is designated as said accessing object, and a second redundancy decoder arranged corresponding to another one of said plurality of redundancy circuits, and activating the corresponding another one redundancy circuit when a defective address stored inside is designated as said accessing object, except for a case where the defective address stored in said first redundancy decoder is designated as said accessing object, wherein m (m is a natural number) said first redundancy decoders are provided corresponding to m said redundancy circuits respectively, and said second redundancy decoder inactivates said corresponding another one redundancy circuit when one of defective addresses stored in said m first redundancy decoders respectively is designated as said accessing object, irrespective of whether or not the defective address stored in said second redundancy decoder is designated as said accessing object.

4. The semiconductor memory device according to claim 3, further comprising:

a selection stop circuit to activate a selection stop signal when one of defective addresses stored inside agrees with an address signal indicating said accessing object, in any one of said m first redundancy decoders, said second redundancy decoder including
an address comparison circuit to activate an agreement determination signal when said address signal agrees with the defective address stored in said second redundancy decoder, and
an agreement comparison invalidation circuit to forcibly inactivate said agreement determination signal when said selection stop signal is activated, wherein
the redundancy circuit corresponding to said second redundancy decoder is activated and inactivated in response to said agreement determination signal.

5. A semiconductor memory device, comprising:

a plurality of memory cells;

a plurality of redundancy circuits, each of which is used to relieve a defective memory cell that occurred in said plurality of memory cells; and a redundancy control circuit to selectively activate one of said plurality of redundancy circuits when said defective memory cell is designated as an accessing object, said redundancy control circuit including a first redundancy decoder arranged corresponding to one of said plurality of redundancy circuits, and activating the corresponding one redundancy circuit when a defective address stored inside is designated as said accessing object, and a second redundancy decoder arranged corresponding to another one of said plurality of redundancy circuits, and activating the corresponding another one redundancy circuit when a defective address stored inside is designated as said accessing object, except for a case where the defective address stored in said first redundancy decoder is designated as said accessing object, wherein a first operation test for obtaining said defective address stored in said first redundancy decoder is performed after a second operation test for obtaining said defective address stored in said second redundancy decoder.

6. The semiconductor memory device according to claim 5, wherein said defective address stored in said second redundancy decoder is determined based on a result of an operation test at a wafer level, and said defective address stored in said first redundancy decoder is determined based on a result of an operation test at a product state.

* * * * *